United States Patent
Suzuki et al.

(10) Patent No.: US 9,130,623 B2
(45) Date of Patent: Sep. 8, 2015

(54) USER EQUIPMENT AND METHOD FOR RADIO COMMUNICATION SYSTEM

(75) Inventors: Hidetoshi Suzuki, Chiyoda-ku (JP);
Hiromasa Umeda, Chiyoda-ku (JP);
Takashi Okada, Chiyoda-ku (JP)

(73) Assignee: NTT DOCOMO, INC., Tokyo (JP)

( * ) Notice: Subject to any disclaimer, the term of this patent is extended or adjusted under 35 U.S.C. 154(b) by 181 days.

(21) Appl. No.: 13/695,526

(22) PCT Filed: Apr. 28, 2011

(86) PCT No.: PCT/JP2011/060480
§ 371 (c)(1),
(2), (4) Date: Oct. 31, 2012

(87) PCT Pub. No.: WO2011/136374
PCT Pub. Date: Nov. 3, 2011

(65) Prior Publication Data
US 2013/0051212 A1    Feb. 28, 2013

(30) Foreign Application Priority Data

Apr. 30, 2010    (JP) .................................. 2010-106000

(51) Int. Cl.
*H04L 27/36* (2006.01)
*H04B 1/04* (2006.01)
*H04L 27/26* (2006.01)

(52) U.S. Cl.
CPC .......... *H04B 1/0475* (2013.01); *H04L 27/2636* (2013.01); *H04L 27/366* (2013.01); *H04B 2001/0441* (2013.01); *H04B 2001/0491* (2013.01)

(58) Field of Classification Search
CPC ... H04L 5/0007; H04L 27/206; H04L 27/265; H04L 27/366; H04L 27/2636; H04M 3/561; H04M 3/568; H04B 1/0475
USPC .................................. 370/203, 208, 210, 268
See application file for complete search history.

(56) References Cited

U.S. PATENT DOCUMENTS 4,292,594 A * 9/1981 David et al. ...................... 331/17
7,068,983 B2 * 6/2006 Kanazawa et al. ............. 455/123

(Continued)

FOREIGN PATENT DOCUMENTS

WO        02/19564 A2    3/2002

OTHER PUBLICATIONS

3GPP TS 36.211 V8.9.0, "3$^{rd}$ Generation Partnership Project; Technical Specification Group Radio Access Network; Evolved Universal Terrestrial Radio Access (E-UTRA); Physical Channels and Modulation," Total 83 Pages, (Dec. 2009).

(Continued)

*Primary Examiner* — Un C Cho
*Assistant Examiner* — Natali N Pascual Peguero
(74) *Attorney, Agent, or Firm* — Oblon, McClelland, Maier & Neustadt, L.L.P.

(57) ABSTRACT

User equipment includes a convertor that converts transmission target frequency domain signal into time domain signal; a quadrature modulator that applies quadrature modulation to the time domain signal; a cancellation signal generator that generates image leakage cancellation signal by converting image signal into time domain signal, and applying the quadrature modulation, wherein the image signal has a frequency component that is symmetrical to the transmission target signal with respect to center of transmission frequency range; an adjuster that monitors the frequency component of the image signal in output signal from the quadrature modulator, and that adjusts amplitude and a phase of image leakage cancellation signal so as to cancel the frequency component; and a combiner that combines output signal from the quadrature modulator with image leakage cancellation signal, and that provides a power amplifier with combined signal.

4 Claims, 6 Drawing Sheets

(56) References Cited

U.S. PATENT DOCUMENTS

| | | | |
|---|---|---|---|
| 7,388,926 B2* | 6/2008 | Ishikawa et al. | 375/285 |
| 7,684,778 B1* | 3/2010 | Qian et al. | 455/302 |
| 8,014,457 B2* | 9/2011 | Aziz et al. | 375/260 |
| 2003/0013426 A1* | 1/2003 | Kim et al. | 455/196.1 |
| 2009/0232260 A1* | 9/2009 | Hayashi et al. | 375/346 |
| 2009/0245422 A1* | 10/2009 | Sampath et al. | 375/302 |

OTHER PUBLICATIONS

3GPP TS 36.101 V8.12.0, "3$^{rd}$ Generation Partnership Project; Technical Specification Group Radio Access Network; Evolved Universal Terrestrial Radio Access (E-UTRA); User Equipment (UE) radio transmission and reception," Total 162 Pages, (Dec. 2010).

TSG RAN WG4 meeting # 48 R4-082001, "Improved Reference Power Amplifier Model for UE Transmitter Simulations," Freescale, Total 25 Pages, (Aug. 18-22, 2008).

International Search Report Issued Jul. 19, 2011 in PCT/JP11/60480 Filed Apr. 28, 2011.

Extended European Search Report issued Feb. 19, 2015, in European Patent Application No. 11775155.

* cited by examiner

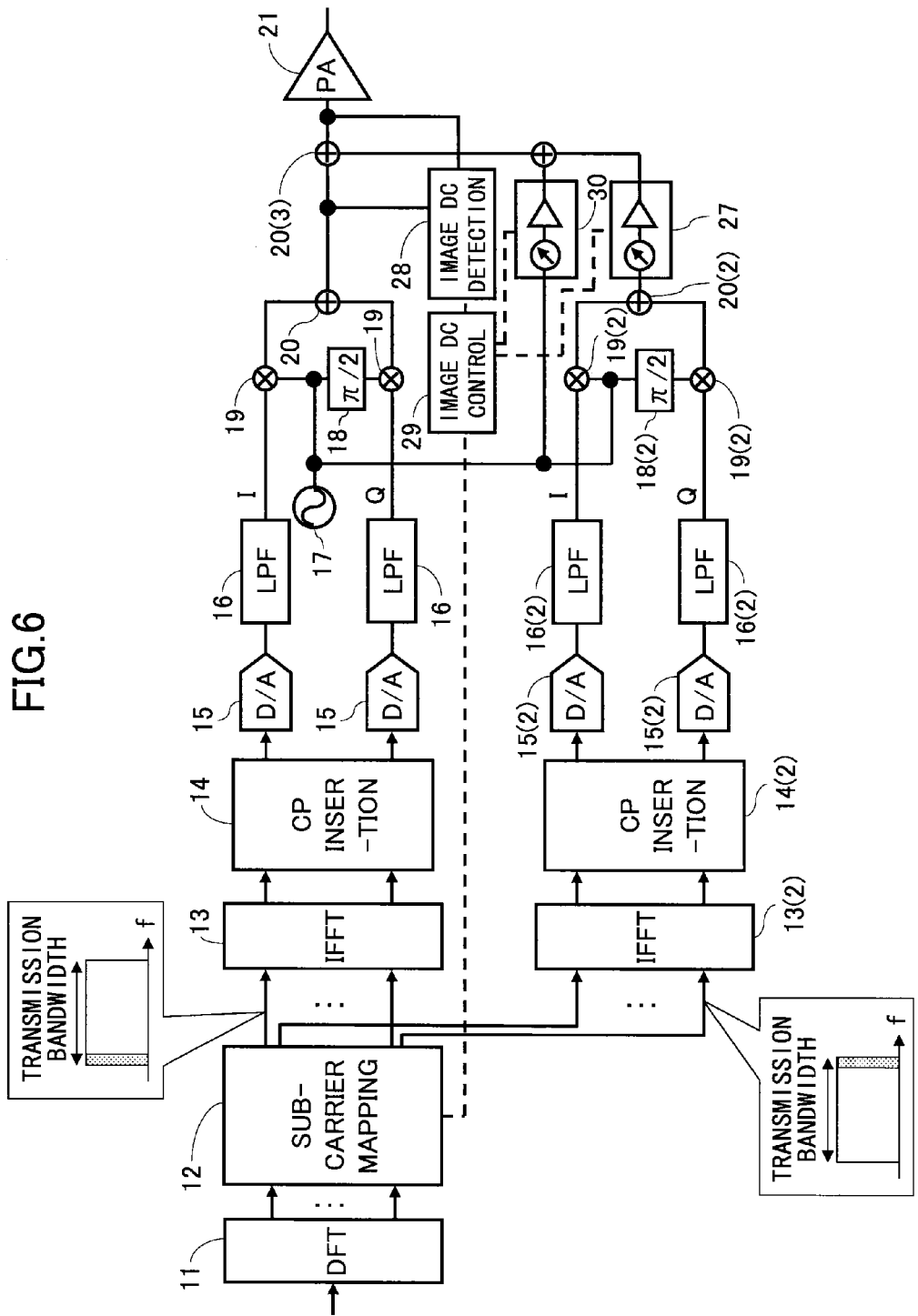

USER EQUIPMENT AND METHOD FOR RADIO COMMUNICATION SYSTEM

TECHNICAL FIELD

The disclosed invention relates to user equipment and a method for a radio communication system.

BACKGROUND ART

In a mobile communication system such as for mobile telephones, an orthogonal frequency division multiplexing (OFDM) scheme and a single-carrier frequency division multiple access (SC-FDMA) scheme are being widely adopted, from viewpoints of widening bandwidths and improving adaptability to a multi-path environment. For example, in a long term evolution (LTE) based mobile communication system, the OFDM scheme is adopted for a downlink, and the SC-FDMA scheme is adopted for an uplink (see Non-Patent Document 1, for example).

RELATED ART DOCUMENT

Non-Patent Document

Non-Patent Document 1: 3GPP TS36.211 V8.9.0(2009-12), Section 5 (Uplink), Section 6 (Downlink)

SUMMARY OF THE INVENTION

Problem to be Solved by the Invention

However, when such technology is used, problems shown below are concerned. In these schemes, a frame to be transmitted is converted into frequency signals by applying a fast Fourier transform (FFT) or by applying a discrete Fourier transform (DFT). The frequency signals are mapped to subcarriers to be transmitted. Subsequent to the mapping, the signals are reconverted into time domain by applying an inverse fast Fourier transform (IFFT). In this manner, a transmission signal is generated. A number of subcarriers being required depends on an amount of data to be transmitted. When the amount of data is small, a few subcarriers are assigned. When the amount of data is large, many subcarriers are assigned. After a quadrature modulation process and a power amplification process have been applied to the thus generated subcarriers, the subcarriers are wirelessly transmitted.

Incidentally, a quadrature modulator may have some kind of inconsistency (an IQ mismatch) with respect to an I-component and a Q-component. For example, a case can be considered where a phase difference between an I signal and a Q signal is shifted from 90 degrees, and another case can be considered where a difference is generated between amplitude of the I signal and amplitude of the Q signal. An output signal from the quadrature modulator having such an IQ mismatch includes an image leakage signal that is not required for the transmission, besides transmission target components, which are the subcarriers required for the transmission. A frequency of the image leakage signal is a frequency that is symmetrical to the transmission target signal with respect to a center of a transmission frequency range. Further, a carrier signal which is leaked from a local signal oscillator of the quadrature modulator may be mixed with the output signal of the quadrature modulator. When the signal including unnecessary signals, such as the image leakage signal and the carrier signal, as well as the transmission target signal is input to a power amplifier (PA), an output signal from the power amplifier may include intermodulation (IM) distortion components of the transmission target signal, the image leakage signal, and/or the carrier signal, besides the transmission target signal, the image leakage signal, and/or the carrier signal. This may cause major interference with other systems.

A problem to be solved by the disclosed invention is to prevent an intermodulation distortion from being generated in a transmission signal that has been power-amplified, when an image signal is mixed with the transmission signal prior to being power-amplified. Here, the image signal has been caused by a quadrature modulation process for the transmission target signal.

Means for Solving the Problem

User equipment according to an embodiment of the disclosed invention is user equipment for a radio communication system including
a convertor that converts a transmission target frequency domain signal into a first time domain signal;
a quadrature modulator that applies quadrature modulation to the first time domain signal;
a cancellation signal generator that generates an image leakage cancellation signal by deriving an image signal, converting the image signal into a second time domain signal, and applying the quadrature modulation to the second time domain signal, wherein the image signal has a first frequency component that is symmetrical to the signal to be transmitted with respect to a center of a transmission frequency range;
an adjuster that monitors the first frequency component of the image signal in an output signal from the quadrature modulator, and that adjusts amplitude and a phase of the image leakage cancellation signal so as to cancel the first frequency component; and
a combiner that combines the output signal from the quadrature modulator with the image leakage cancellation signal, and that provides a power amplifier with the combined signal.

Effect of the Present Invention

According to the disclosed invention, it is possible to prevent the intermodulation distortion from being generated in the transmission signal that has been power amplified, when the image signal, which is caused by the quadrature modulation process for the transmission target signal, is mixed with the transmission signal prior to being power-amplified.

BRIEF DESCRIPTION OF THE DRAWINGS

FIG. 6 is a diagram showing a second modified example where the image leakage signal is also reduced.

Figure 1:
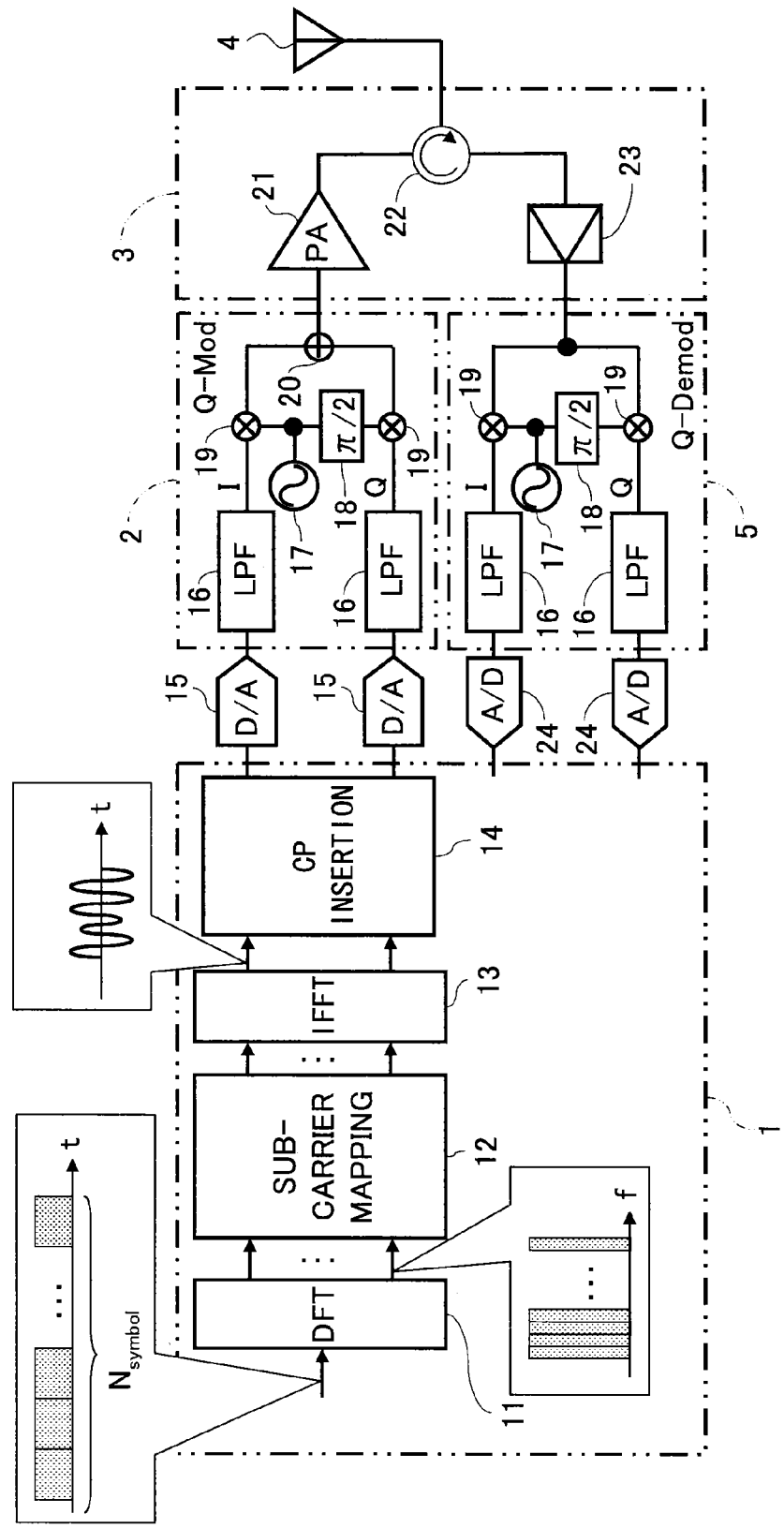
FIG. 1 is a schematic diagram of user equipment.

EMBODIMENTS FOR CARRYING OUT THE INVENTION (A) User equipment according to an embodiment of the disclosed invention is user equipment for a radio communication system including a convertor (13) that converts a transmission target frequency domain signal into a first time domain signal;

a quadrature modulator (17, 18, 19, and 20) that applies quadrature modulation to the first time domain signal;

a cancellation signal generator (13(2), 18(2), 19(2), and 20(2)) that generates an image leakage cancellation signal by deriving an image signal, converting the image signal into a second time domain signal, and applying the quadrature modulation to the second time domain signal, wherein the image signal has a first frequency component (fi) that is symmetrical to the signal to be transmitted (fs) with respect to a center of a transmission frequency range (fc);

an adjuster (25, 26, and 27) that monitors the first frequency component of the image signal in an output signal from the quadrature modulator, and that adjusts amplitude and a phase of the image leakage cancellation signal so as to cancel the first frequency component; and a combiner (20(3)) that combines the output signal from the quadrature modulator with the image leakage cancellation signal, and that provides a power amplifier with the combined signal.

(B) The converter may include a Fourier transform unit (11) that applies a discrete Fourier transform or a fast Fourier transform to a data frame representing a transmission target signal;

a mapping unit (12) that generates the transmission target frequency domain signal by mapping a Fourier transformed signal onto a frequency resource that has been reported from a radio base station; and an inverse fast Fourier transform unit (13) that generates the first time domain signal by applying an inverse fast Fourier transform to the mapped signal.

(C) The adjuster may adjust the amplitude and the phase of the image leakage cancellation signal by monitoring a second frequency component of the image signal in an output signal from the combiner (20(3)), besides monitoring the first frequency component of the image signal in the output signal from the quadrature modulator (20), so as to cancel the first frequency component and the second frequency component.

(D) The adjuster may monitor a third frequency component of a carrier signal that leaks to the output signal from the quadrature modulator, and generate a carrier leakage cancellation signal (28, 29, and 30), wherein amplitude and a phase of the carrier leakage cancellation signal have been adjusted to cancel the leaked carrier signal, and wherein the combiner (20(3)) may combine the output signal from the quadrature modulator, the image leakage cancellation signal, and the carrier leakage cancellation signal, and provide the power amplifier with the combined signal.

Embodiments will be explained from the following viewpoints.
1. Image leakage signal
2. Reduction of image leakage signal
3. Example of operations
4. First modified example
5. Second modified example
6. Summary

First Embodiment

<Image Leakage Signal>

Hereinafter, there will be explained a method of reducing an image leakage signal in a mobile terminal by referring to figures. If it is possible, the same reference numerals are attached to the corresponding same portions, and duplicated explanations are omitted. First, there will be explained that an image leakage signal may be generated in a typical SC-FDMA mobile terminal.

FIG. 1 is a schematic diagram of a terminal for mobile communication. The disclosed invention may be applied not only to a terminal for mobile communication, but also to any suitable user equipment. The user equipment may be a mobile terminal or a fixed terminal. Specifically, the user equipment may be a mobile phone, an information terminal, a personal digital assistant (PDA), and/or a mobile personal computer. However, the user equipment is not limited to these.

In FIG. 1, the reference numeral 1 indicates a baseband signal generator (BB), the reference numeral 2 indicates a quadrature modulator, the reference numeral 3 indicates a radio (RF) circuit that processes a radio signal, the reference numeral 4 indicates an antenna, and the reference numeral 5 indicates a quadrature demodulator.

In the baseband signal generator (BB) 1, the reference numeral 11 indicates a DFT operator, the reference numeral 12 indicates a subcarrier mapping unit that allocates subcarriers to a frequency range, the reference numeral 13 indicates an IFFT operator that converts the mapped subcarriers into time domain, and the reference numeral 14 indicates a CP insertion unit that inserts a cyclic prefix (CP) or a guard interval. The reference numerals 15 indicate D/A converters that convert digital signals into analog signals.

In the quadrature modulator 2 and the quadrature demodulator 5, the reference numerals 16 indicate law pass filters (LPF) that remove harmonics, the reference numerals 17 indicate local signal oscillators that generate transmission frequencies, the reference numerals 18 indicate phase converters that generate phase differences for IQ signals, the reference numerals 19 indicate mixers that perform frequency conversions by mixing the BB signals with the signals from the corresponding local signal oscillators, and the reference numeral 20 indicates a multiplexer circuit that combines the IQ signals and generates a transmission signal.

In the radio (RF) circuit 3, the reference numeral 21 indicates a signal amplifier (PA) that amplifies the generated transmission signal to desired transmission power, the reference numeral 22 indicates a transmission/reception sharing device or a duplexer (DUP) that allows a transmitting and receiving antenna to be shared for transmission and reception, the reference numeral 23 indicates a low-noise amplifier (LNA) that amplifies a received signal. The reference numerals 24 indicate A/D converters that convert analog signals into digital signals.

Here, depending on a configuration of the mobile terminal, an isolator and an antenna switch may be included. However, for the sake of simplicity of the explanation, these are omitted.

Audio information or data information, which is desired to be transmitted by the mobile terminal, is divided into data frames by the baseband signal generator (BB) 1, and a discrete Fourier transform is applied to the data frames by the DFT operator 11. In this manner, a frequency spectrum is generated. In the explanation, the SC-FDMA scheme is assumed where the DFT operation is used. However, it is not required. For example, the OFDM scheme may be used where the FFT operation is used. In accordance with an instruction from a base station (eNB), the subcarrier mapping unit 12 maps one portion of the frequency spectrum, as a subcarrier, onto available frequencies. Specifically, the available frequencies are frequencies of a resource block (RB), which has been reported from the base station. The signals are converted by the IFFT operator 13 into a time waveform. The CP insertion unit 14 inserts a predetermined guard time into the time waveform, and a symbol to be transmitted is generated. A signal including the symbol is converted into analog signals by the corresponding D/A converters 15. The converted signals become an I signal and a Q signal, respectively, in the quadrature modulator 2, and the corresponding LPFs 16 remove harmonics. One of the mixers 19 mixes the I signal with a signal (a carrier frequency signal) from one of the local signal oscillators 17. The other mixer 19 mixes the Q signal with a signal that is obtained by shifting, by the phase converter 18, a phase of the signal from the one of the local signal oscillators 17 by 90 degrees. In this manner, the frequencies of the I signal and the Q signal are frequency converted into transmission frequencies. The multiplexer circuit 20 combines the I signal and the Q signal. The combined signal is amplified by the power amplifier (PA) 21 to a desired power level, and the signal is transmitted from the transmitting and receiving antenna 4 through the duplexer (DUP) 22.

Figure 2A:
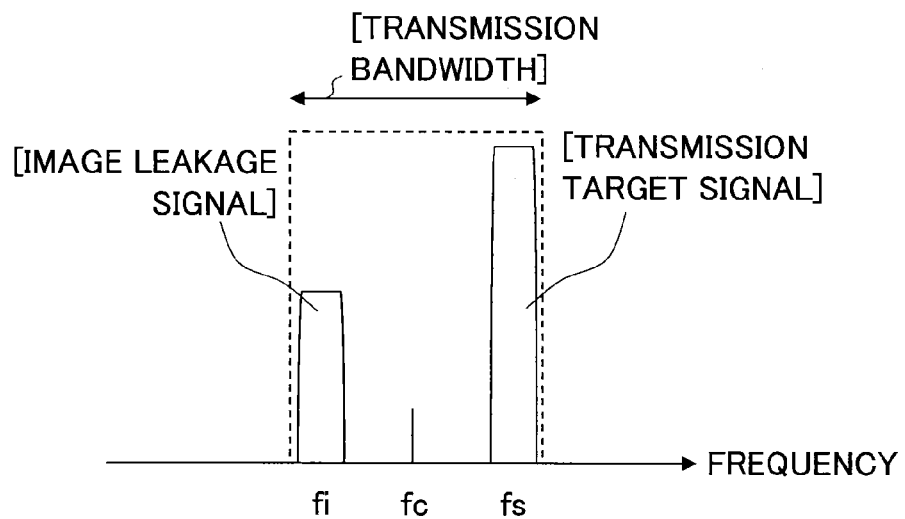
FIG. 2A is a diagram showing an input signal to a power amplifier.
Figure 2B:
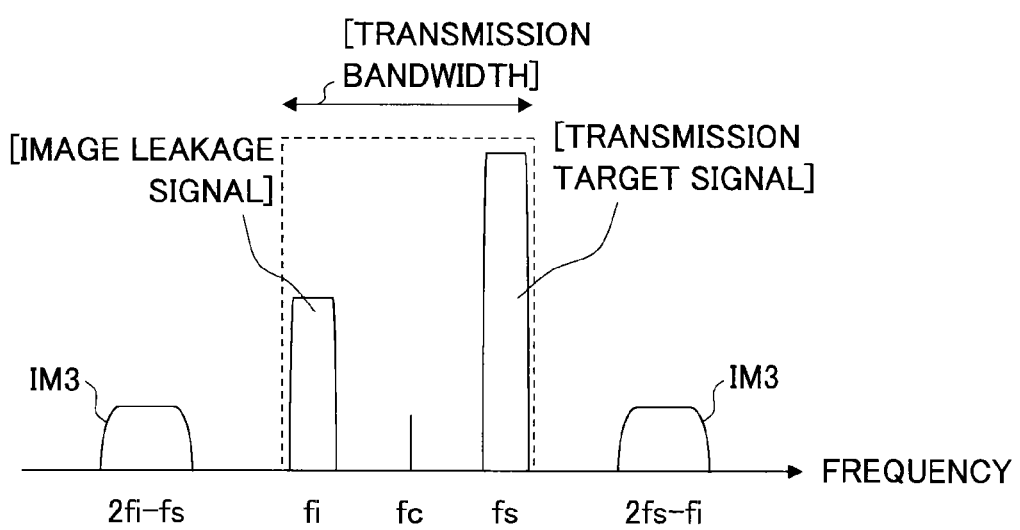
FIG. 2B is a diagram showing an output signal from the power amplifier.

FIG. 2A schematically shows an input signal to the power amplifier (PA) 21. FIG. 2B schematically shows an output signal from the power amplifier (PA) 21. The signal to be transmitted (transmission target signal) is mapped to any position within a transmission bandwidth as shown in FIG. 2A, where the width corresponds to the amount of data. In the example shown in the figure, the transmission target signal is allocated to a higher frequency side of the transmission bandwidth. However, it is not required. The image leakage signal is generated, for example, when the phase of the phase converter 18 is shifted from 90 degrees, or when a difference is generated between the amplitude of the I signal and the amplitude of the Q signal. The image leakage signal occurs at a position (fi) where the transmission target signal is folded while setting the carrier frequency (fc) as a folding point. When the transmission target signal and the image leakage signal are input to the power amplifier (PA) 21, an output signal from the power amplifier (PA) 21 includes intermodulation distortion components, as shown in FIG. 2B. In the example shown in the figure, third-order intermodulation distortions (IM3) occur at frequency positions of 2fi-fs and 2fs-fi, due to the frequency fs of the transmission target signal and the frequency fi of the image leakage signal. Similarly, fifth-order intermodulation distortions occur at frequency positions of 3fi-2fs and 3fs-2fi, and seventh- and higher-order intermodulation distortions also occur (for simplicity of illustration, the fifth- and higher-order intermodulation distortion components are not shown in the figure). In many cases, the intermodulation distortion components IM3, IM5, IM7, . . . occur outside the transmission bandwidth. In some cases, the intermodulation distortion components occur in a frequency band of another system, and the intermodulation distortion components cause serious interference to the other system. When the intermodulation distortion components occur in the transmission bandwidth, since interference in the system itself is increased in addition to the interference caused by the image leakage signal, it is possible that the throughput of the system itself is lowered.

2. Reduction of Image Leakage Signal

Figure 3:
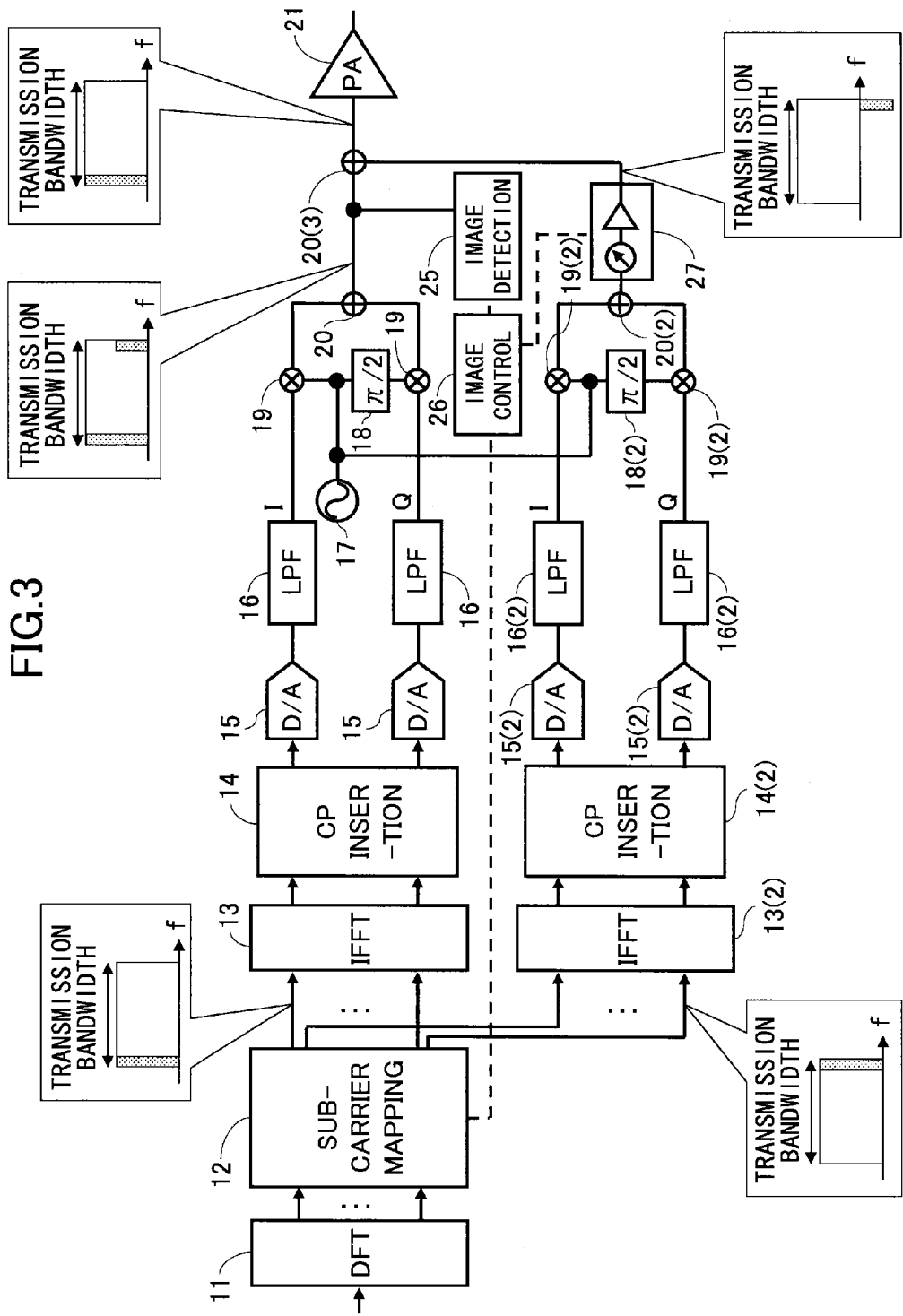
FIG. 3 is a diagram showing the user equipment according to one embodiment.

FIG. 3 shows a mobile terminal according to the embodiment that reduces the image leakage signal. In addition to the elements explained by referring to FIG. 1, the mobile terminal includes an IFFT operator 13 (2); a CP insertion unit 14(2); digital/analog (D/A) converters 15(2); low pass filters (LPF) 16(2); a phase converter 18(2); mixers 19(2); a multiplexer circuit 20(2); an image detection unit 25; an image controller 26; a phase/amplitude controller 27; and a multiplexer circuit 20(3).

Similar to the case of the mobile terminal of FIG. 1, audio information or data information, which is desired to be transmitted, is divided into data frames by the baseband signal generator (BB) 1, and a discrete Fourier transform is applied to the data frames by the DFT operator 11. In this manner a frequency spectrum is generated. In accordance with an instruction from the base station (eNB), the subcarrier mapping unit 12 maps one portion of the frequency spectrum, as a subcarrier, onto available frequencies. Specifically, the available frequencies are frequencies of a resource block (RB), which has been reported from a base station. The signals are converted by the IFFT operator 13 into a time waveform. The CP insertion unit 14 inserts predetermined guard time into the time waveform, and a symbol to be transmitted is generated. A signal including the symbol is converted into analog signals by the corresponding D/A converters 15. The converted signals become an I signal and a Q signal, respectively, in the quadrature modulator 2, and the corresponding LPFs 16 remove harmonics. One of the mixers 19 mixes the I signal with a signal (a carrier frequency signal) from a local signal oscillator 17. The other mixer 19 mixes the Q signal with a signal that is obtained by shifting a phase of the signal from the local signal oscillators 17 by the phase converter 18 by 90 degrees. In this manner, the frequencies of the I signal and the Q signal are frequency converted into transmission frequencies. The multiplexer circuit 20 combines the I signal with the Q signal. The multiplexer circuit 20(3) combines the combined signal with an image leakage removal signal, and the combined signal is input to the power amplifier (PA) 21. Subsequently, the power amplifier (PA) 21 amplifies the power level of the signal, and the signal is transmitted from the transmitting and receiving antenna through the duplexer (DUP).

In the example shown in FIG. 3, the subcarrier mapping unit 12 generates an image leakage removal subcarrier. Frequencies of the image leakage removal subcarrier are frequencies that are symmetrical to the frequencies, to which the transmission target signal has been mapped by the subcarrier mapping unit 12, with respect to the center of the transmission bandwidth. Similar to the case of the transmission target signal, the IFFT operator 13(2) transforms the image leakage removal subcarrier into a time waveform, and the CP insertion unit 14(2) inserts predetermined guard time to the time waveform. The signal is converted into analog signals, as an I signal and a Q signal for the quadrature modulation, by the corresponding D/A converters 15(2), and the low pass filters 16(2) remove harmonics from the corresponding analog signals. One of the mixers 19(2) mixes the I signal with the signal from the local signal oscillator 17. The other mixer 19(2) mixes the Q signal with a signal that is obtained by shifting, by the phase converter 18(2), a phase of the signal from the signal oscillator by 90 degrees. In this manner, the frequencies of the I signal and the Q signal are frequency converted into transmission frequencies. The multiplexer circuit 20(2) combines the I signal and the Q signal, and thereby the image leakage removal signal is generated.

The transmission signal that has been combined by the multiplexer circuit 20 is monitored by the image detection unit 25. The image detection unit detects an extent of a power level of the image leakage signal in the output signal from the multiplexer circuit. Information regarding the image leakage signal (e.g., the frequency) is reported from the image controller 26. The image controller 26 has obtained the information regarding the image leakage signal from the subcarrier mapping unit 12. The information regarding the power level that has been detected by the image detection unit 25 is transmitted to the image controller 26. The image controller 26 transmits a control signal to the phase/amplitude controller 27 based on the information regarding the image leakage signal from the image detection unit 25. The amplitude and the phase of the image leakage removal signal output from the multiplexer circuit 20(2) are adjusted by the control signal, so as to cancel the image leakage signal. Namely, the amplitude is adjusted to provide the power that is the same as the power of the image leakage signal, and the phase is adjusted to be opposite to the phase of the image leakage signal. The multiplexer circuit 20(3) multiplexes a signal including the transmission target signal and the image leakage signal with the image leakage removal signal. The image leakage signal and the carrier leakage removal signal cancel with each other. Therefore, the output signal from the multiplexer circuit 20(3) is a signal in which the image leakage signal is sufficiently suppressed. As a result, the signal that is input to the power amplifier (PA) 21 does not include or almost does not include the image leakage signal, and likelihood that a large intermodulation distortion component is generated in the amplified signal is substantially eliminated.

The above-described invention principle can be applied to any transmission target signal, or can be limitedly applied to signals that have been selected based on a certain criteria. For example, when there are a small number of subcarriers that have been mapped to the frequency domain, the invention principle may be applied. When there are a large number of subcarriers, the invention principle may not be applied. That is because an extent that the intermodulation distortion components are generated varies depending on whether a large number of subcarriers have been mapped to the frequency domain.

In the example of FIG. 3, the subcarrier mapping unit 12 generates the image leakage removal subcarrier. However, an output signal from the subcarrier mapping unit may be input to the IFFT operator 13(2) while inverting the frequencies at the center of the transmission bandwidth.

In FIG. 3, for the sake of convenience of the explanation, the IFFT operator 13, the CP insertion unit 14, and the local signal oscillator 17 are separately described. However, these processing elements may be integrated as one element.

3. Example of Operations

Figure 4:
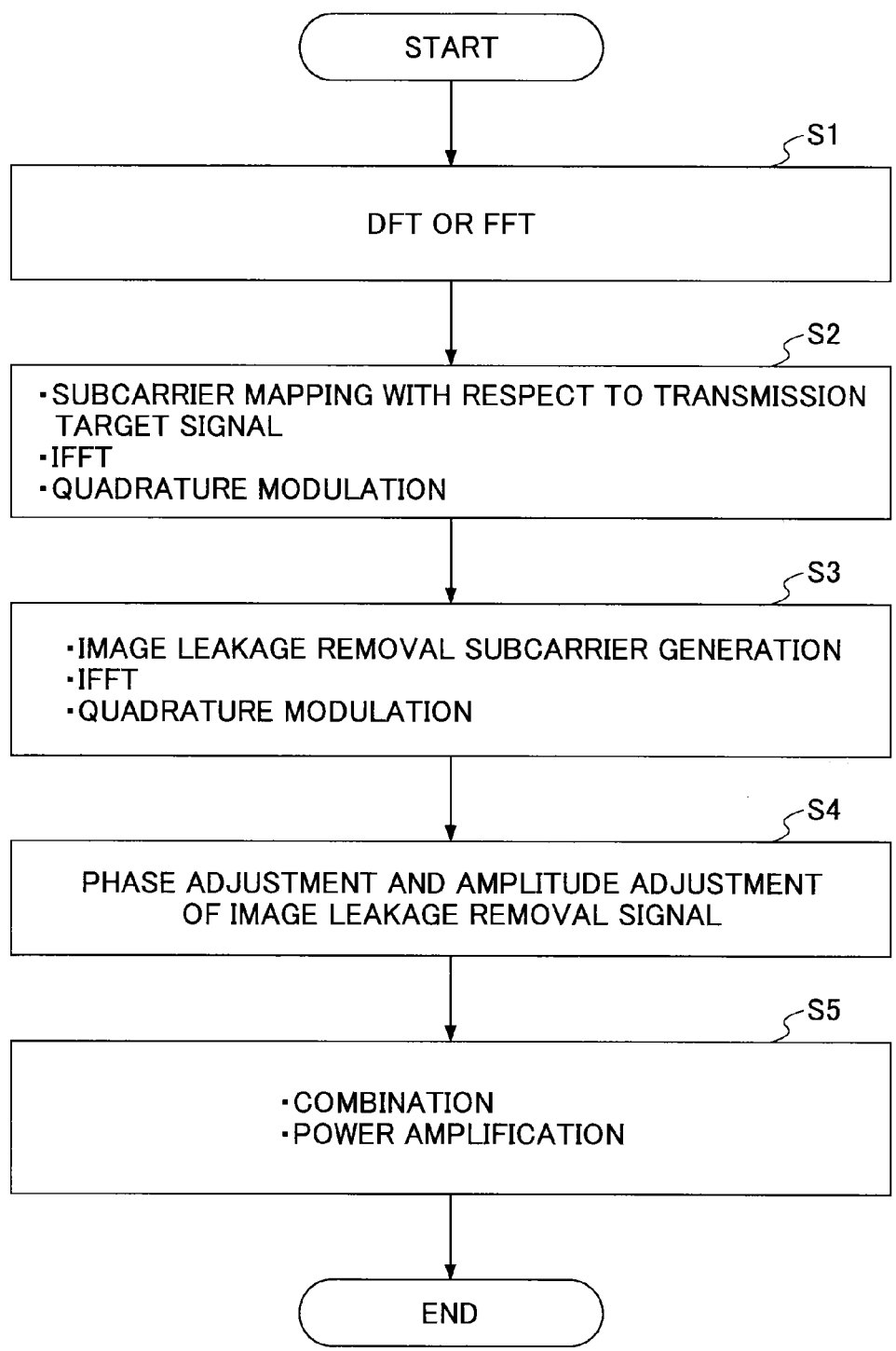
FIG. 4 is a diagram showing an example of a method of reducing an image leakage signal.

FIG. 4 shows an example of a method of reducing the image leakage signal. The method is used in a mobile terminal (more generally, in user equipment) such as shown in FIG. 3. At step S1, a transmission target signal to be transmitted is converted into a frequency domain signal by the DFT or by the FFT.

At step S2, the transmission target signal in the frequency domain is mapped onto the frequencies reported from the base station, and the mapped signal is transformed into a time domain signal by the IFFT. The quadrature modulation is applied to the time domain signal.

At step S3, the image leakage removal subcarrier is generated. Frequency components of the image leakage removal subcarrier are symmetric to those of the transmission target signal with respect to the center of the bandwidth. The image leakage removal subcarrier is transformed into a time domain signal by the IFFT. The quadrature modulation is applied to the time domain signal, thereby generating the image leakage removal signal.

For the sake of convenience of the explanation, step S3 is performed subsequent to step S2. However, it is not required, and all or a part of the processes of steps S2 and S3 may be simultaneously performed.

At step S4, the amplitude and the phase of the image leakage removal signal are adjusted to be the amplitude to provide the same power as the power of the image leakage signal and to be the phase that is opposite to that of the image leakage signal, respectively. The amplitude and the phase of the image leakage signal are identified by monitoring the signal to which the quadrature modulation has been applied at step S2.

At step S5, the signal to which the quadrature modulation has been applied at step S2 (including the transmission target signal and the image leakage signal) is combined with the image leakage removal signal. The image leakage signal and the image leakage removal signal cancel with each other, and as a consequence, the transmission target signal remains. The transmission target signal is amplified by the power amplifier (PA) 21. Since the input to the power amplifier (PA) 21 substantially does not include the image leakage signal, the output from the power amplifier (PA) 21 substantially does not include the image leakage signal and the intermodulation distortion components.

4. First Modified Example

As described above, the input to the power amplifier (PA) 21 substantially does not include the image leakage signal. However, it may be considered to actually monitor the output from the multiplexer circuit 20(3), from the viewpoint of further ensuring to suppress the image leakage signal.

Figure 5:
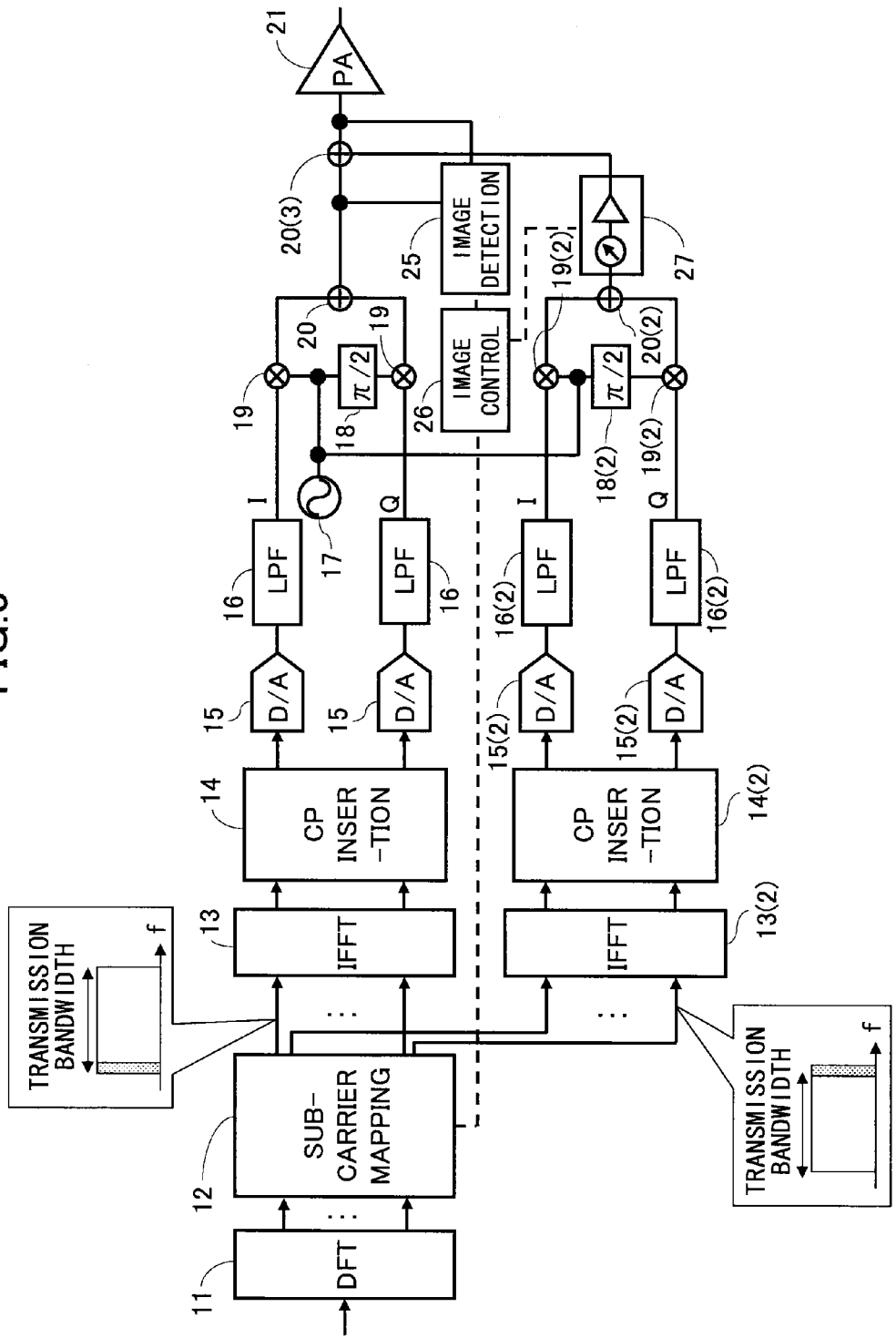
FIG. 5 is a diagram showing a first modified example where a combined output is also monitored.

In FIG. 5, the image detection unit 25 monitors the output from the multiplexer circuit 20(3) so as to confirm whether the image leakage signal is actually removed. Namely, the image detection unit 25 monitors the image leakage signal both in the input and the output of the multiplexer circuit 20(3). The image controller 26 and the phase/amplitude controller 27 adjust the amplitude and the phase of the image leakage removal signal so that the image leakage signal is cancelled.

Here, it is not required to simultaneously monitor the input and the output of the multiplexer circuit 20(3). For example, during the start of operation of the mobile terminal, the amplitude and the phase of the image leakage removal signal may be adjusted only by monitoring the input to the multiplexer circuit 20(3). Subsequently, when the operation is stabilized, the amplitude and the phase of the image leakage removal signal may be adjusted only by monitoring the output from the multiplexer circuit. Performing such a switching corresponds to performing a coarse adjustment during the start of the operation of the mobile terminal and performing a fine adjustment subsequent to stabilizing the operation.

5. Second Modified Example

Unnecessary wave components that are mixed with the transmission signal due to the quadrature modulator (e.g., 17, 18, 19, and 20) include a carrier signal (a leakage signal from the local signal oscillator 17), in addition to the image leakage signal.

FIG. 6 indicates a modified example where not only the image leakage signal, but also the carrier signal is suppressed. Instead of the image detection unit 25 and the image controller 26 in FIGS. 3 and 5, an image DC detection unit 28 and an image DC controller 29 are utilized. Further, in addition to the elements that have been explained by referring to FIGS. 3 and 5, a DC phase/amplitude controller 30 is added. The image DC detection unit 28 detects the power level of the leaked carrier signal (DC), besides detecting the power level of the image leakage signal. The image DC controller 29 generates a control signal for adjusting the amplitude and the phase of the image leakage removal signal, and transmits it to the phase/amplitude controller 27. Further, the image DC controller 29 generates a control signal for adjusting amplitude and a phase of a carrier leakage removal signal that is branched from the local signal oscillator 17, and transmits it to the DC phase/amplitude controller 30. The amplitude and the phase of the carrier leakage removal signal are the same amplitude as that of the leaked carrier signal and the phase that is opposite to that of the leaked carrier signal. The DC phase/amplitude controller 30 adjusts the power level and the phase of the carrier leakage removal signal, in response to the control signal. The multiplexer circuit 20(3) combines the output signal from the multiplexer circuit 20, the image leakage removal signal, and the carrier leakage removal signal. The image leakage signal and the image leakage removal signal cancel with each other. Further, the leaked carrier signal and the carrier leakage removal signal cancel with each other. Consequently, only the transmission target signal remains in the output from the multiplexer circuit 20(3).

6. Summary

According to the disclosed invention, after generating subcarriers by the DFT, the image leakage removal signal is generated by performing mapping of the subcarriers in the subcarrier mapping unit, generating the image leakage removal subcarriers having frequencies that are symmetric to those of the mapped subcarriers with respect to the center of the bandwidth, transforming the subcarriers by the IFFT operation, and performing the D/A conversion and the quadrature modulation. Further, the power of the image leakage signal is detected by observing the quadrature modulated output signal, and the power of the image leakage removal signal is adjusted in accordance with the power of the detected image leakage signal. The phase is adjusted so that it becomes opposite to the output of the quadrature modulator. The image leakage signal can be reduced by combining such image leakage removal signal at the output portion of the quadrature modulator. Consequently, the IM components caused by the transmission signal and the image leakage signal can be effectively reduced compared to a case where this function is not implemented, and the interference with other systems can be reduced. Further, since amounts of the interference with other systems can be regulated to be less than or equal to predefined amounts, the transmission can be performed with higher transmission power, and thereby a service area can be enlarged.

In the above, the explanation has been provided while referring to specific embodiments, but the embodiments are merely illustrative, and variations, modifications, alterations and substitutions could be conceived by those skilled in the art. For example, the disclosed invention may be applied to any appropriate mobile communication system where frequency resources are dynamically allocated. For example, the disclosed invention may be applied to an LTE system, an LTE-Advanced system, an IMT-Advanced system, a WiMAX based system, a Wi-Fi based system and the like. Specific examples of numerical values have been used in order to facilitate understanding of the invention. However, these numerical values are simply illustrative, and any other appropriate values may be used, except as indicated otherwise. The separations of the embodiments or the items are not essential to the present invention. Depending on necessity, a subject matter described in two or more items may be combined and used, and a subject matter described in an item may be applied to a subject matter described in another item (provided that they do not contradict). For the convenience of explanation, the devices according to the embodiments of the present invention have been explained by using functional block diagrams. However, these devices may be implemented in hardware, software, or combinations thereof. The present invention is not limited to the above-described embodiments, and various variations, modifications, alterations, substitutions and so on are included, without departing from the spirit of the present invention.

The present international application claims priority based on Japanese Patent Application No. 2010-106000, filed on Apr. 30, 2010, the entire contents of which are hereby incorporated by reference.

The invention claimed is:

1. User equipment for a radio communication system comprising:
   a converter configured to convert a transmission target signal in a frequency domain that is to be transmitted into a first signal in a time domain;
   a quadrature modulator configured to apply quadrature modulation to the first signal;
   a cancellation signal generator configured to generate an image leakage cancellation signal by deriving an image signal in the frequency domain, converting the image signal into a second signal in the time domain, and applying the quadrature modulation to the second signal, wherein the image signal has a first frequency component that is symmetrical to the transmission target signal with respect to a center of a transmission frequency range in the frequency domain;
   an adjuster configured to monitor the first frequency component of the image signal in an output signal from the quadrature modulator, and configured to adjust amplitude and a phase of the image leakage cancellation signal so as to be equal amplitude and opposite phase to the first frequency component; and
   a combiner configured to combine the output signal from the quadrature modulator with the image leakage cancellation signal, and configured to provide a power amplifier with the combined signal,
   wherein the adjuster is configured to monitor a third frequency component of a carrier signal that leaks in the output signal from the quadrature modulator, and is configured to generate a carrier leakage cancellation signal, wherein amplitude and a phase of the carrier leakage cancellation signal have been adjusted to cancel the leaked carrier signal, and
   wherein the combiner is configured to combine the output signal from the quadrature modulator, the image leakage cancellation signal, and the carrier leakage cancellation signal, and the combiner is configured to provide the power amplifier with the combined signal.

2. The user equipment according to claim 1,
   wherein the converter includes
   a Fourier transform unit configured to apply a discrete Fourier transform or a fast Fourier transform to a data frame representing a signal to be transmitted;
   a mapping unit configured to generate the transmission target signal in the frequency domain by mapping a Fourier transformed signal onto a frequency resource that is reported from a radio base station; and an inverse fast Fourier transform unit configured to generate the first signal in the time domain by applying an inverse fast Fourier transform to the generated transmission target signal.

3. The user equipment according to claim 1, wherein the adjuster is configured to adjust the amplitude and the phase of the image leakage cancellation signal by monitoring a second frequency component of the image signal in an output signal from the combiner, besides monitoring the first frequency component of the image signal in the output signal from the quadrature modulator, so as to cancel the first frequency component and the second frequency component.

4. A method of user equipment for a radio communication system comprising:

converting a transmission target signal in a frequency domain that is to be transmitted into a first signal in a time domain;

applying, by a quadrature modulator, quadrature modulation to the first signal;

generating an image leakage cancellation signal by deriving an image signal in the frequency domain, converting the image signal into a second signal in the time domain, and applying the quadrature modulation to the second signal, wherein the image signal has a first frequency component that is symmetrical to the transmission target signal with respect to a center of a transmission frequency range in the frequency domain;

monitoring the first frequency component of the image signal in an output signal from the quadrature modulator, and adjusting amplitude and a phase of the image leakage cancellation signal so as to be equal amplitude and opposite phase to the first frequency component;

monitoring a third frequency component of a carrier signal that leaks in the output signal from the quadrature modulator;

generating a carrier leakage cancellation signal, wherein amplitude and a phase of the carrier leakage cancellation signal have been adjusted to cancel the leaked carrier signal; and combining the output signal from the quadrature modulator with the image leakage cancellation signal and with the carrier leakage cancellation signal, and providing a power amplifier with the combined signal.

* * * * *